United States Patent [19]

Scholes et al.

[11] Patent Number: 5,498,758
[45] Date of Patent: Mar. 12, 1996

[54] METHOD FOR THE COLD END COATING OF GLASSWARE USING A VAPORIZER HAVING AN INTERNAL FLOW PATH FROM A RESERVOIR OF LIQUID COATING MATERIAL TO A VAPOR DEPOSITION CHAMBER

[75] Inventors: Addison B. Scholes; Joseph Lamirand, both of Muncie; Duane Saltsgaver, Noblesville, all of Ind.

[73] Assignee: Alltrista Corporation, Muncie, Ind.

[21] Appl. No.: 246,835

[22] Filed: May 20, 1994

[51] Int. Cl.$^6$ .......................... C23C 16/44; C03C 17/42
[52] U.S. Cl. ............ 427/255; 427/255.5; 427/255.6; 65/60.2; 65/60.3
[58] Field of Search ............... 427/255, 255.5, 427/255.6; 118/726; 65/60.3, 60.2

[56] References Cited

U.S. PATENT DOCUMENTS

| | | | |
|---|---|---|---|
| 2,995,533 | 8/1961 | Parmer et al. | 260/23 |
| 3,357,853 | 12/1967 | Pickard | 117/124 |
| 3,386,855 | 6/1968 | Scholes | 117/124 |
| 3,437,515 | 4/1969 | Quinn et al. | 117/100 |
| 3,446,936 | 5/1969 | Hanson et al. | 118/726 |
| 3,487,035 | 12/1969 | Bogart | 260/23 |
| 3,645,778 | 2/1972 | Nesteruk | 117/93.4 |
| 3,712,829 | 1/1973 | Steigelman | 117/54 |
| 3,801,361 | 4/1974 | Kitaj | 117/124 |
| 3,876,410 | 4/1975 | Scholes | 65/60 |
| 3,989,004 | 11/1976 | Scholes | 427/255 |
| 3,997,693 | 12/1976 | Kircher | 427/384 |
| 4,039,310 | 8/1977 | Sipe et al. | 65/25 |
| 4,130,407 | 12/1978 | Ida | 65/30 |
| 4,135,014 | 1/1979 | Salensky et al. | 428/35 |
| 4,168,345 | 9/1979 | de Massey et al. | 428/441 |
| 4,242,412 | 12/1980 | Funaki et al. | 428/412 |
| 4,431,692 | 2/1984 | Hofmann et al. | 428/35 |
| 4,517,242 | 5/1985 | Sinha et al. | 428/336 |
| 4,517,243 | 5/1985 | Sinha et al. | 428/336 |
| 4,529,657 | 7/1985 | Franz | 428/410 |
| 4,615,916 | 10/1986 | Henderson | 427/255 |
| 4,668,268 | 5/1987 | Linder et al. | 65/60.1 |
| 4,719,126 | 1/1988 | Henery | 427/165 |
| 4,719,127 | 1/1988 | Greenberg | 427/165 |
| 4,812,332 | 3/1989 | Kerherve et al. | 427/168 |

FOREIGN PATENT DOCUMENTS

| | | | |
|---|---|---|---|
| 59-141442 | 8/1984 | Japan | 427/255 |
| 1471293 | 4/1977 | United Kingdom . | |

*Primary Examiner*—Terry J. Owens
*Attorney, Agent, or Firm*—Willian Brinks Hofer Gilson & Lione

[57] ABSTRACT

A method for applying a cold end lubricating coating to glassware articles on which a hot end metal oxide coating may have been applied includes conveying the glassware articles through a heated vapor deposition chamber provided by thermally isolating a conveyer portion. Lubricating coating material, such as a fatty acid, is liquified in a heated reservoir inside a heated tank which also contains a heated vapor chamber. The reservoir and vapor chamber are separated by an internal wall of the tank. At least one flow of the liquefied coating material is directed to at least one vaporizer positioned on the tank adjacent to the reservoir and vapor chamber. The liquefied coating material is vaporized by feeding a flow of pressurized air to each vaporizer such that vaporous particles of liquefied coating material are entrained in the air. The air and entrained vaporous particles are directed to a vapor deposition chamber. The glassware articles are coated by impingement of the vaporous particles on them, and the glassware articles are then cooled such that the coating solidifies.

14 Claims, 6 Drawing Sheets

METHOD FOR THE COLD END COATING OF GLASSWARE USING A VAPORIZER HAVING AN INTERNAL FLOW PATH FROM A RESERVOIR OF LIQUID COATING MATERIAL TO A VAPOR DEPOSITION CHAMBER

FIELD OF THE INVENTION

This invention relates to an effective new method for forming a single, inexpensive, thin, transparent cold end coating for glassware that remains tenacious, lubricous and protective after exposure to high temperatures and sterilization and does not interfere with labeling of the glassware.

BACKGROUND OF THE INVENTION

Formation of durable lubricous coatings have been found to be of great importance in the glass container industry to provide glass articles, or ware, with at least one layer of an adhering lubricating material in order to facilitate high speed automatic handling of glass articles in production lines, to protect articles against contact abrasion damage, and to prevent unsightly scuff and scratch damage. In this regard, uncoated glass articles are highly susceptible to abrasion damage, and it has been reported that newly formed uncoated glass articles can quickly lose up to 75% of their bursting strength due, at least in part, to surface abrasion caused by contact with other glass articles as normally occurs during processing and handling of such articles.

While some coatings have been applied to articles just prior to use, to be fully effective, the articles should be coated soon after they are formed, and in the case of annealed articles, for example, such coatings have been applied immediately before and/or after annealing.

In practice, pre-annealing coatings, sometimes referred to as "hot end" coatings, are applied to glassware after it leaves the glassware machine in an initial coater. The initial coater forms a very thin metal oxide coating on the outer surface of the glassware, which is then carried to the annealing lehr. Such pre-annealing coating methods and apparatus are disclosed, for example, in U.S. Pat. Nos. 4,431,692; 4,615,916; 4,668,268; 4,719,126; and 4,719,127 and others listed below.

A number of post-annealing coatings, sometimes referred to as "cold end" coatings, and methods and apparatus for their application, have been disclosed, for example, in U.S. Pat. Nos. 2,995,533; 3,386,855; 3,487,035; 3,712,829; 3,801,361; 3,876,410; 3,989,004; 3,997,693; 4,039,310; 4,130,407; 4,135,014; 4,517,242; 4,517,243; 4,529,657 and 4,812,332.

U.S. Pat. Nos. 3,876,410 and 3,989,004 disclose an apparatus and method for applying a coating material that is, at least in part, vaporizable at a readily obtainable temperature and capable of producing vapor that is contact-adherent to the article to be coated to produce a durable and tenacious, lubricous coating. In general, the patents disclose method and apparatus for forming acceptable coating material from organic materials, particularly hydrocarbons formed from methylene, ethylene, propylene, butylene, fatty acids and their derivatives and the like.

Caproic acid, stearic acid, oleic acid, myristic acid, linoleic acid and palmatoleic acid are disclosed as typical of the compositions yielding desirable coatings on glassware when used in the method and apparatus of these patents.

Oleic acid has been used in the commercial practice of the inventions of these patents. Oleic acid is a bland liquid in normal condition, having an appearance similar to that of cooking oil. It has been approved for use in connection with food products. As little as 1 drop of oleic acid every 17 seconds has been found sufficient to produce an acceptable lubricating coating on catsup bottles passing through the vapor at the rate of 80 bottles per minute. Thus, 1 drop of oleic acid provides sufficient vapor to coat about 20 catsup bottles. Further, oleic acid is readily available in high-grade quality at low cost. Because of these advantages, oleic acid has been a primary coating material used to provide post-annealing coatings.

The apparatus used to apply oleic acid in commercial practice includes a hood forming a vapor booth for a portion of a conveyer, which is operated to carry articles of glassware through the vapor booth. The vapor booth includes, generally, a booth top and an upper plate and a plurality of partitions between the booth top and the upper plate forming a plurality of plenum chambers arranged, one after the other, over and along the conveyer portion. The sides of the vapor booth are formed by a pair of downwardly extending panels that provide not only the means to support the vapor booth with respect to the conveyer, but a plurality of flow directing and controlling vanes in communication with each of the plurality of plenums. The upper plate of the vapor booth that forms the top of the plurality of plenums has a plurality of openings, one in each of the plurality of plenums, for carrying a fan in each of the plurality of plenums. The booth top also has a plurality of openings, at least one for each plenum, permitting vapor flow between the plurality of plenums and the booth formed by the booth top and sides. The upper plate carries a plurality of flow producing fans and fan motors, with one fan being located in each plenum, and the fans are capable of being rotated by their fan motors in alternatively opposite directions to provide counter-rotating flows of coating material vapor within the vapor booth and along the conveyer portion.

A plurality of vapor flows of oleic acid coating material are introduced through a plurality of vapor discharge tubes located to direct the flow of coating material vapor into the circulating flow of each plenum. The vapor of oleic acid coating material is formed by means forming a liquid coating reservoir including a bottom, four sides and a top. The oleic acid, which has a melting point of 57° F. (14° C.), is in a liquid state. The reservoir top also carries a vapor-forming nozzle having its liquid outlet connected with the coating material in the reservoir by an inlet tube extending from the vapor-forming nozzle to adjacent the reservoir bottom. The vapor-forming nozzle is also connected with a source of pressurized air for vaporization of the oleic acid coating material, and the vaporized coating material and pressurized air are directed from the vapor-forming nozzle through the reservoir top and into the reservoir, where the non-vaporous particles were removed by gravity. The remaining oleic acid vapor is urged by the influence of the pressurized air to and through the vapor discharge tube and introduced into the vapor hood for application to the glassware.

In practice, the oleic acid glassware coating is frequently supplemented by an additional cold-end coating using polyethylene to permit sterilization of the glassware. Oleic acid is liquid at temperatures in excess of 57° F. (14° C.). When glassware coated with oleic acid alone is exposed to elevated temperatures, such as in an autoclave for the sterilization of food containers, such as baby food jars, the oleic acid coating is substantially removed by the harsh and hot conditions, and the scratch resistance and lubricity are deleteriously affected, thereby increasing the risk of breakage. Breakage during processing is serious because of the possibility of slivers or fragments of the shattered glass being deposited in adjacent ware, which is completely unacceptable.

DISCLOSURE OF THE INVENTION

This invention provides an effective new method for providing glassware with a single, improved, non-toxic, tenacious, lubricous and protective cold end coating that retains its lubricity and protective qualities after exposure to the high temperatures and harsh conditions of sterilization, remains transparent and does not interfere with labeling. This invention permits reduced coating costs, the elimination of supplemental cold end coatings, such as polyethylene, and increased lubricity and durability of the cold end coating.

The method of the invention permits the application of a cold end coating with coating materials having high temperature melting points, for example, coating materials having melting points in excess of 150° F. The method of the invention comprises enclosing and thermally isolating a conveyer portion to provide a coating zone; conveying a series of glassware articles to be coated at elevated temperature through the coating zone; heating the coating zone to provide an elevated temperature along the conveyer portion; liquefying a normally solid coating material by elevating its temperature; producing and directing a plurality of controlled flows of liquified coating material at elevated temperature to a plurality of vaporizers; producing and directing a plurality of controlled flows of pressurized air to the plurality of vaporizers; atomizing the plurality of controlled flows of liquified coating material with the plurality of controlled flows of pressurized air and entraining the atomized particles of liquified coating material in a plurality of flows of air; directing the plurality of flows of air and entrained atomized particles of liquified coating material into a heated chamber; directing a plurality of flows of air and entrained vaporous liquified coating material particles to the enclosed and thermally isolated coating zone; providing a plurality of circulating and counter-rotating currents of heated air in the enclosed and thermally isolated coating zone; introducing said plurality of flows of air and entrained vaporous liquified coating material particles into the plurality of circulating and counter-rotating currents of heated air within the enclosed and thermally isolated coating zone, with at least one flow of air and entrained vaporous liquified coating material particles being introduced into each current of heated air for circulation in the coating zone; coating the series of glassware articles by impingement of the vaporous liquified coating material particles on the glassware articles in the coating zone; and cooling said glassware articles to form a solid coating thereon.

In a preferred method of the invention a single, inexpensive, thin transparent cold end coating of solid stearic acid may be formed on glassware by the steps above. In the formation of the stearic acid coating, the enclosed thermally isolated coating zone is maintained at a temperature in excess of the melting point of stearic acid but below about 400° F., preferably at a temperature of about 180° F.–220° F., and the glassware articles enter the coating zone at temperatures above the melting point of stearic acid, preferably at a temperature of about 250° F. The glassware articles can be exposed to stearic acid vapor, provided at a rate of one pound per day to glassware articles at a rate of one gross per minute. The resulting cold end coating can eliminate additional cold end coatings, such as polyethylene, that are frequently applied to permit sterilization of the glassware articles. The resulting novel glassware articles have a surprisingly tenacious, lubricous and inexpensive coating that remains protective after exposure to high temperatures and sterilization and does not interfere with labeling of the glassware.

Further features and advantages of the invention are shown and described in the drawings and the further description of the invention that follows.

DETAILED DESCRIPTION OF A PREFERRED EMBODIMENT OF THE INVENTION

Figure 1:
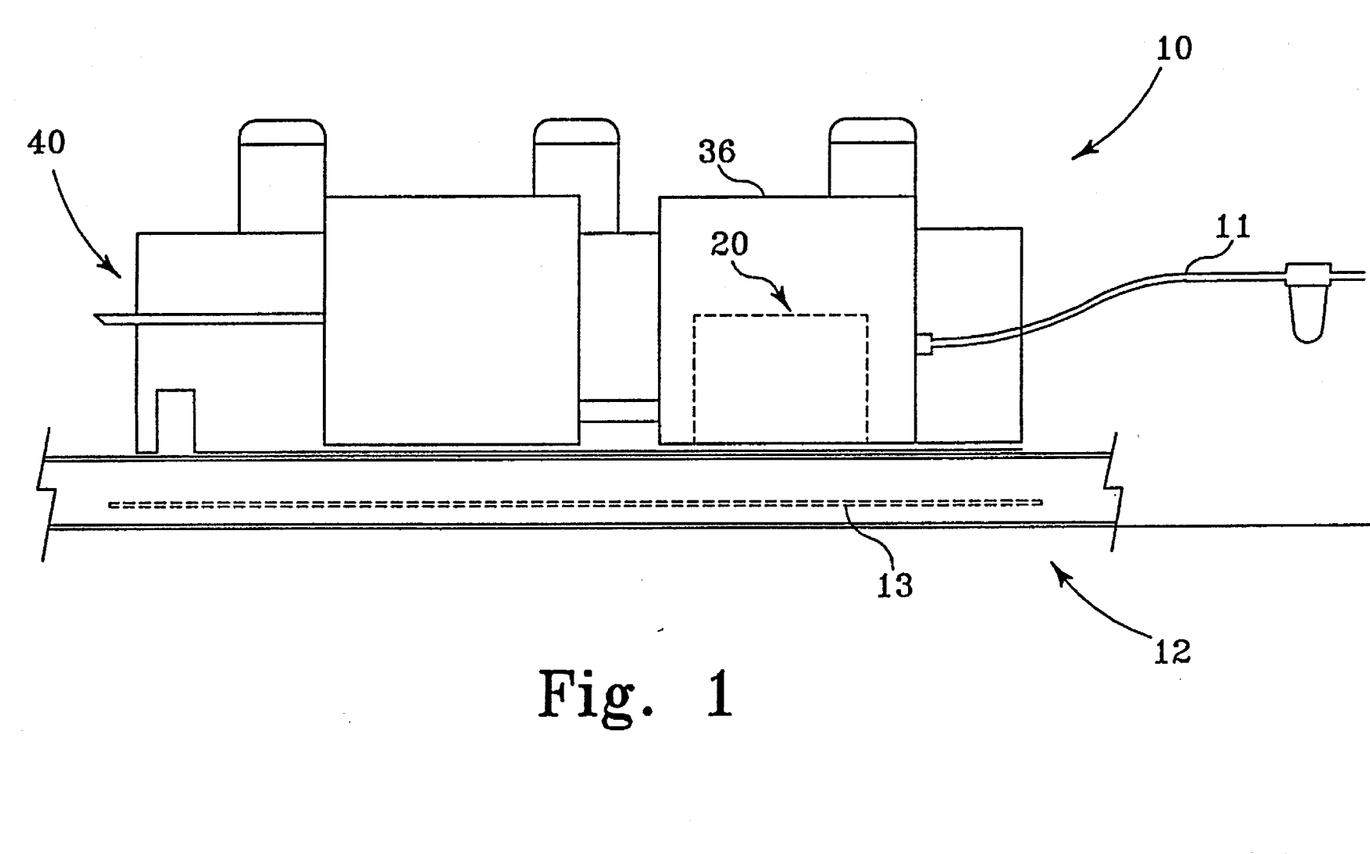
FIG. 1 is a side view of the apparatus of the invention.

FIGS. 1–8 show of an apparatus 10 of the invention. FIG. 1 is a side view of the apparatus 10 showing means 11 for connecting the apparatus with a source of pressurized air, an enclosure 20 (shown in phantom lines in FIG. 1) for means 21 for providing a flow of heated and liquified coating material and vapor-forming means 31 for the flow of heated and liquified coating material, and a thermally isolated and partially heated vapor booth 40.

Figure 3:
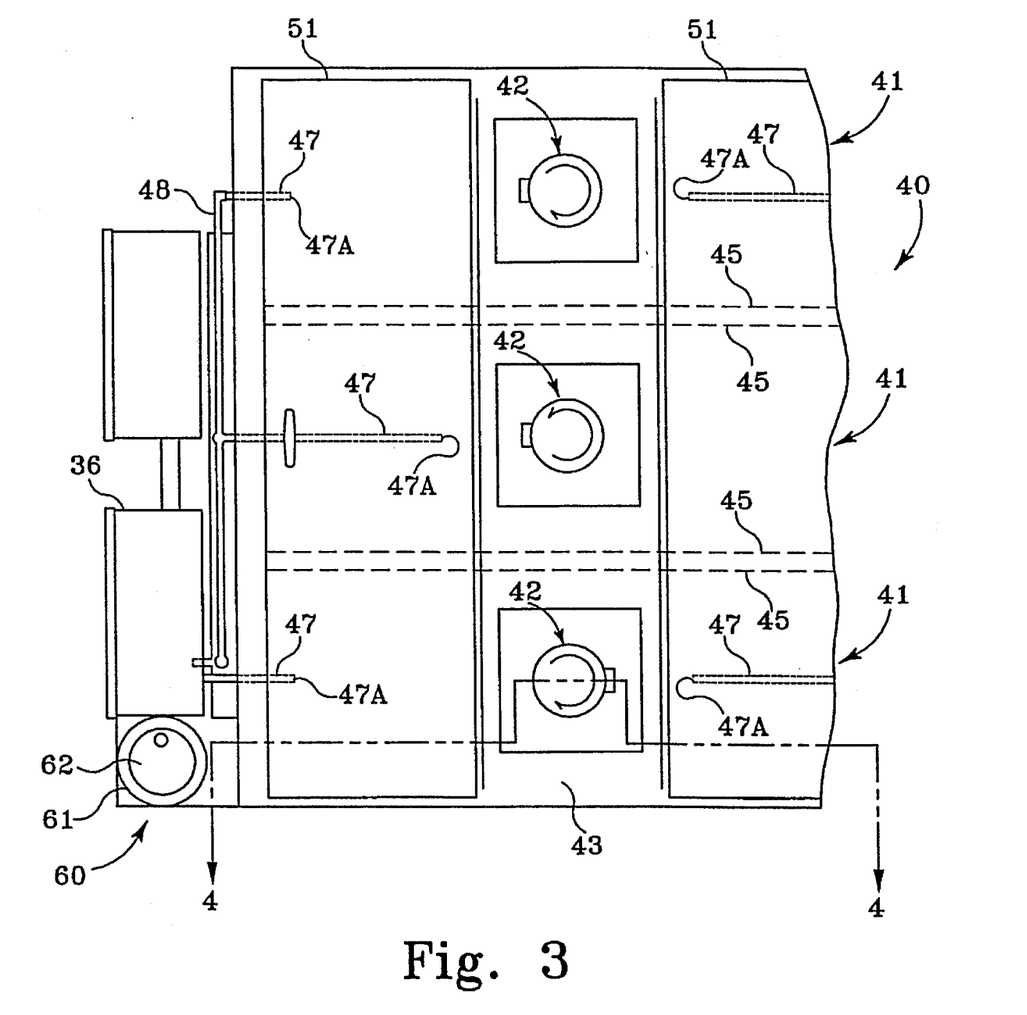
FIG. 3 is a partial top view of the apparatus of FIG. 1.
Figure 4:
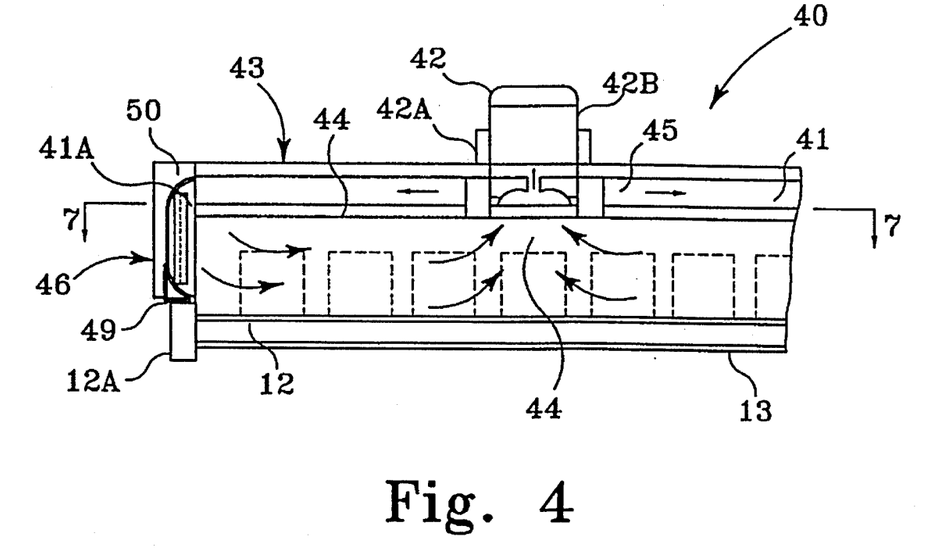
FIG. 4 is a cross-sectional view of FIG. 3 taken at a plane corresponding to line 4—4 of FIG. 3 and showing circulation within the apparatus and with respect to a plurality of glassware articles shown in phantom line.

As shown in FIGS. 1 and 4, and described in greater detail below, the means 40 forming the vapor booth encloses a portion of a conveyer 12 for carrying glassware (indicated in phantom line in FIG. 4) through the vapor booth. FIG. 4 is a cross-sectional view of the means 40 forming the vapor booth taken at a plane corresponding to line 4—4 of FIG. 3, which is a partial top view of the apparatus of the invention. As shown in FIGS. 1 and 4, the apparatus may be provided with a vapor confining plate 13 below the enclosed conveyer portion and under the vapor booth 40.

Figure 2:
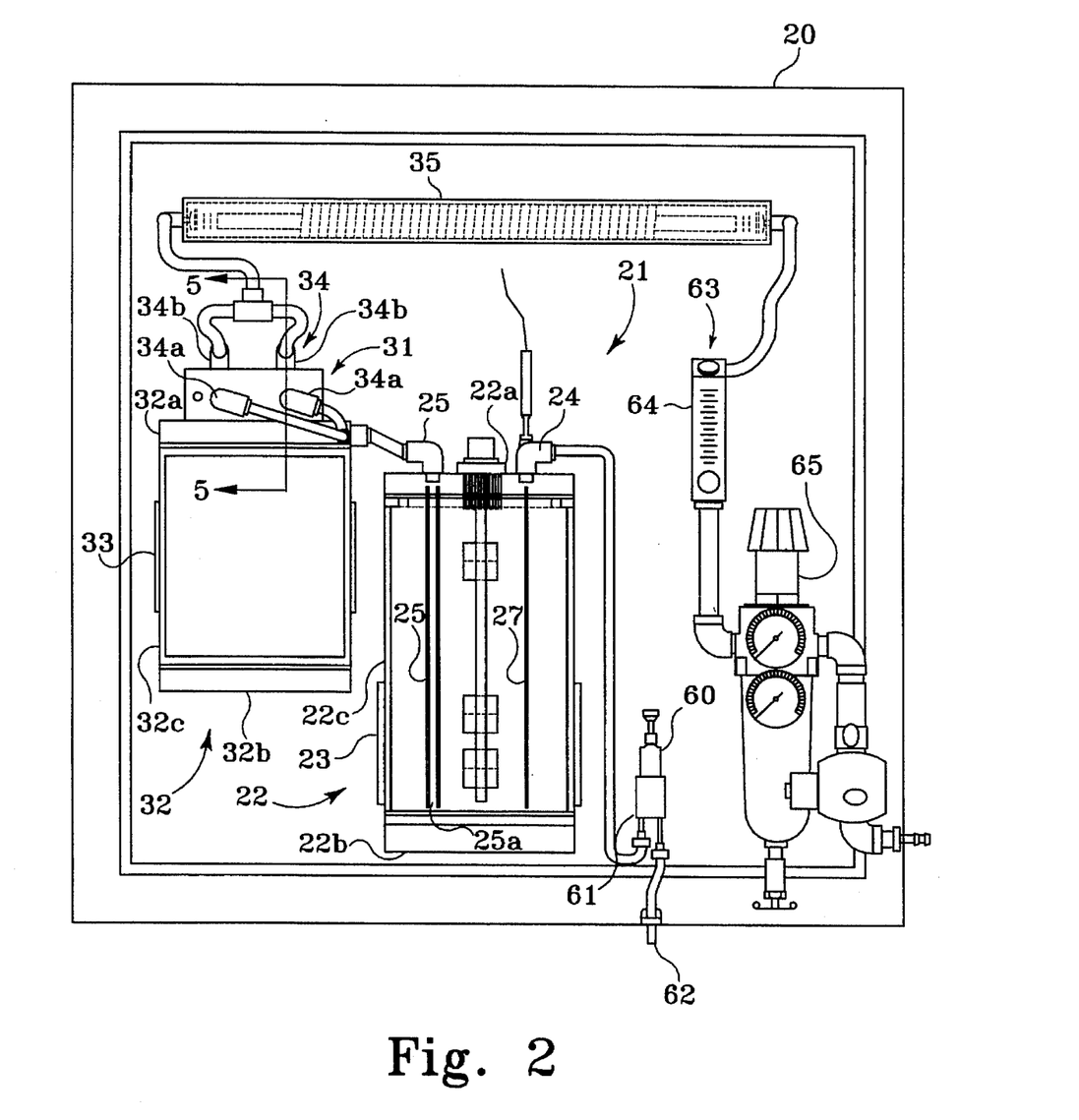
FIG. 2 is a front view of the apparatus of FIG. 1 showing the interior of one of the control enclosures and the enclosed means for providing and for atomizing a heated and liquified flow of coating material to provide coating material vapor.
Figure 5:
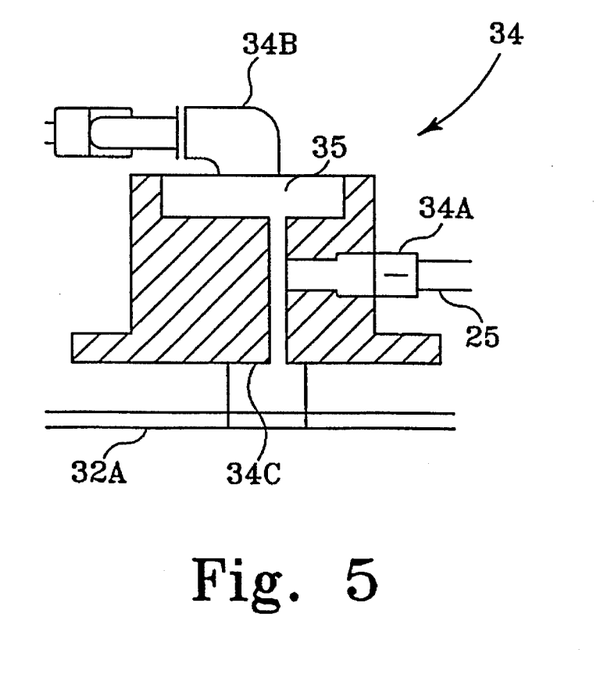
FIG. 5 is a partial cross-sectional view taken at a plane corresponding to line 5—5 of FIG. 2.

The means for providing and vaporizing a flow of heated and liquified coating material are shown in greater detail in FIGS. 2 and 5.

As shown in FIG. 2, the enclosure 20 houses a means 21 for providing a regulated flow of heated and liquified coating material and a vapor-forming means 31 for forming the regulated flow of heated and liquified coating material from the coating material source 21 into a coating material vapor with a regulated flow of gas. The means 21 forming a source of liquid coating material includes a reservoir 22 having a top 22a, a bottom 22b and a sidewall 22c therebetween. An electric heater 23 for the reservoir 22 is connected in good thermal contact with the sidewall 22c of the reservoir 22. The reservoir 22 also includes an inlet 24 formed therein for receipt of a pressurizing gas. As shown in FIG. 2, the interior of closure 20 carries an adjustable gas pressure regulator 60 having its outlet 61 connected with reservoir inlet 24 and its inlet 62 arranged for connection with means 11 for providing pressurized air to the apparatus. The reservoir 22 also carries an outlet tube 25 having a withdrawal opening 25a adjacent the bottom 22b of the reservoir 22. The reservoir 22 also carries means 26 for providing a signal of the level of liquid material in the reservoir 22 and a temperature sensor 27 for providing a control signal for the electric heater 23 to maintain the liquid state of coating material in reservoir 22. The temperature sensor 27, the apparatus control and electric heater 23 can cooperate in a way known in the art, to maintain the interior of reservoir 22 at temperatures up to 180° F.–220° F. The adjustable gas pressure regulator 60 provides a regulated gas pressure of, for example, 0–10 psi, within the reservoir 22 and an adjustable regulated flow of heated and liquified coating material from the outlet tube 25.

As further shown in FIG. 2, the means 31 for forming a coating material vapor includes a housing 30 connected with outlet tube 25. The vapor-forming means 31 includes a vapor chamber 32 having a top 32a, a bottom 32b and a sidewall 32c therebetween. A second electric heater 33 for the vapor chamber 32 is thermally connected with the sidewall 32c of the vapor chamber 32 and is operated by the apparatus control in response to a second temperature sensor (not shown) to maintain the vapor chamber of temperatures at 200° F.– 250° F. A plurality of vapor-forming atomizers 34 is carried by the top 32a of the vapor chamber 32.

FIG. 5 is a partial cross-sectional view taken at a plane through housing 30 corresponding to the line 5—5 of FIG. 2 to illustrate the vapor-forming atomizers 34 in greater detail. In FIGS. 2 and 5, each of the plurality of vapor-forming atomizers 34 have a coating material inlet 34a that is connected with the coating material source 22 and receives therefrom a regulated flow of heated, liquified coating material. Each of the plurality of atomizers 34 also has an atomizing air inlet 34b connected with an internal passageway (not shown) in the housing 30 for receiving a regulated flow of atomizing air. As shown in greater detail in the cross-section of FIG. 5, each of the vapor-forming atomizers 34 direct their respective interior flows of atomizing air and heated, liquified coating material to coact in forming a coating material vapor and direct coating material vapor from their vapor outlets 34c into the vapor chamber 32.

As further shown in FIG. 2, the enclosure 20 houses, in addition to the source of coating material 21 and the coating material vapor-forming means 31, an air heater 35 and an air flow regulator 63, which is connected to the input of air heater 35. Air heater 35 may also be self-controlled to maintain the temperature of the air at its outlet in the range of 200° F.–250° F. The air flow regulator 63 includes a flow meter 64 to provide a visual indication of the flow rate of atomizing air through the plurality of vapor-forming atomizers 34, and an adjustable air flow regulator 65 is used to adjust the flow of air to the vapor-forming means 31 to provide coating material vapor from the regulated flow of heated and liquified coating material from the outlet 25 of coating material source 21.

Figure 9:
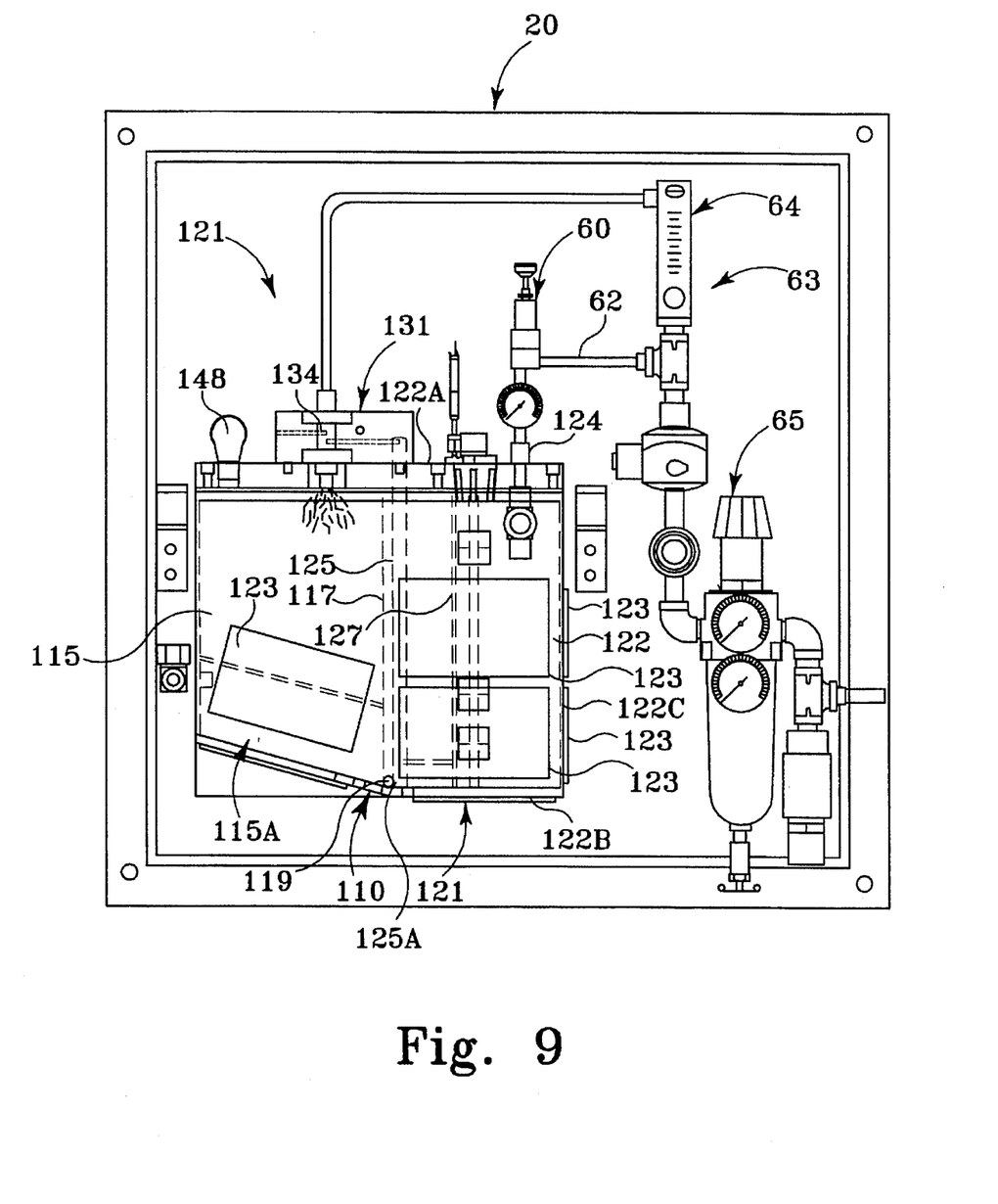
FIG. 9 is a view of an alternative embodiment of the apparatus shown in FIG. 2.

According to a preferred embodiment of the invention, as shown in FIG. 9, means 121 for providing a regulated flow of heated and liquified coating material includes a single tank 110 having a vapor chamber 115 and a reservoir 122 separated by a partitioning wall 117. A one-way check valve 119 provides communication through the partitioning wall 117 between the reservoir 122 and the vapor chamber 115.

The reservoir 122 includes a top 122a, a bottom 122b and a sidewall 122c therebetween. An electric heater 123 for the reservoir 122 is connected in good thermal contact with the sidewall 122c of the reservoir 122. The reservoir 122 also includes an inlet 124 formed therein for receipt of a pressurizing gas. An outlet tube 125, positioned in the reservoir 122 has a withdrawal opening 125a adjacent the bottom 122b of the reservoir 122.

The reservoir 122 further includes an internal temperature sensor 127 for providing a control signal for electric blanket heaters 123. The temperature sensor 127, the apparatus control and the electric blanket heater 123 can cooperate in a way known in the art, to maintain the interior of the reservoir 122 at temperatures up to 200° F.–250° F. An adjustable gas pressure regulator 60 provides a regulated gas pressure of, for example, 1–20 psi within the reservoir 122 and an adjustable regulated flow of heated and liquified coating material from the outlet tube 125.

Vapor-forming means 131 is positioned on top of the vapor chamber 115 and includes a plurality of vapor-forming atomizers 134. A commercially available cartridge heater (not shown) is coupled to the vapor-forming means 131 to heat the vapor-forming means 131 and, thereby the incoming air to prevent a deleterious solidification of the coating material. Vapor formed by the atomizers 134 is carried into the vapor chamber 115 and through vapor outlets 148 to the vapor booth 40. The lower portion of the vapor chamber 115 includes a recovery chamber 121 for collecting the portion of the vapor that doesn't go through the outlets 148 to the vapor booth 40. The portion of the vapor that eventually falls to the bottom of the vapor chamber 115 is collected and returned to the reservoir 122 by periodically pressurizing the vapor chamber 115 and forcing the collected vapors through the check valve 119 into the reservoir 122.

The preferred embodiment has a major thermal advantage. That is, the use of a single tank to house the vapor chamber 115 and the reservoir 122 minimizes the use of external fluid lines, thereby reducing the likelihood of unwanted solidification of the coating material. Specifically, outlet tube 125 passes heated and liquified material between the reservoir 122 and the vapor-forming means 131 directly without leaving the heated tank 110. As a result, the cartridge heater (not shown) in the vapor-forming means provides sufficient heat to enable operation of the apparatus without resorting to external heating of the air flow. Thus, the air heater (35 in FIG. 2) is eliminated from the presently preferred embodiment, thereby reducing complexity of the equipment and reducing the manufacturing and operating costs of the invention.

"Vapor" as used in this application refers to atomized coating material particles small enough (that is, having a sufficiently small mass to surface ratio) that they are carried by a quiescent flow of air, for example, particles with the diameter of a few microns.

The vapor formed by the plurality of vapor-forming atomizers 34 of the FIG. 2 embodiment is carried from the vapor chamber 32 through outlets 48 (FIG. 3) to the means forming a vapor booth 40. As shown in FIGS. 2 and 5, as a result of operation of the apparatus, a flow of air is directed from the adjustable air flow source 63 and through the plurality of vapor-forming atomizers 34 and from the atomizer outlets 34c into the vapor chamber 32. The pressurization resulting in the vapor chamber 32 creates an outward flow of heated air and vapor which may be directed into the means 40 forming a vapor booth as shown in FIG. 3.

When the level in coating material in reservoir 22 becomes too low, level sensor 26 will provide an output signal and operate a warning at the apparatus control to advise the personnel responsible for operation of the apparatus that the coating material in reservoir 22 should be replenished.

In the embodiment of FIG. 9, a flow of air is directed from the adjustable air flow source through inlet 124 and into reservoir 122 to pressurize the reservoir 122 and thereby urge liquid coating material through the outlet tube 125 to the vapor-forming atomizers 134. At the same time, a flow of air is directed from the adjustable air flow source through the plurality of vapor-forming atomizers 134. As the air flow passes through the vapor-forming atomizers 134, it atomizes the liquid coating material and directs the resultant vapor into the vapor chamber 122. The inflow of vapor pressurizes the vapor chamber 122, thereby creating an outward flow of air and vapor which may be directed through the outlets 148 and into the means forming a vapor booth 40.

Figure 6:
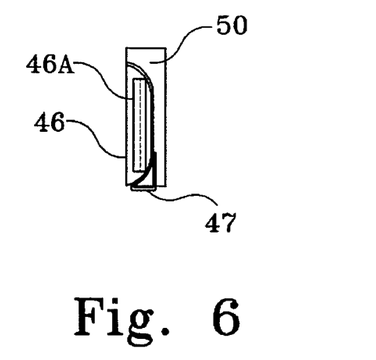
FIG. 6 is a cross-sectional view of FIG. 8 taken at a plane corresponding to line 6—6 of FIG. 8.
Figure 7:
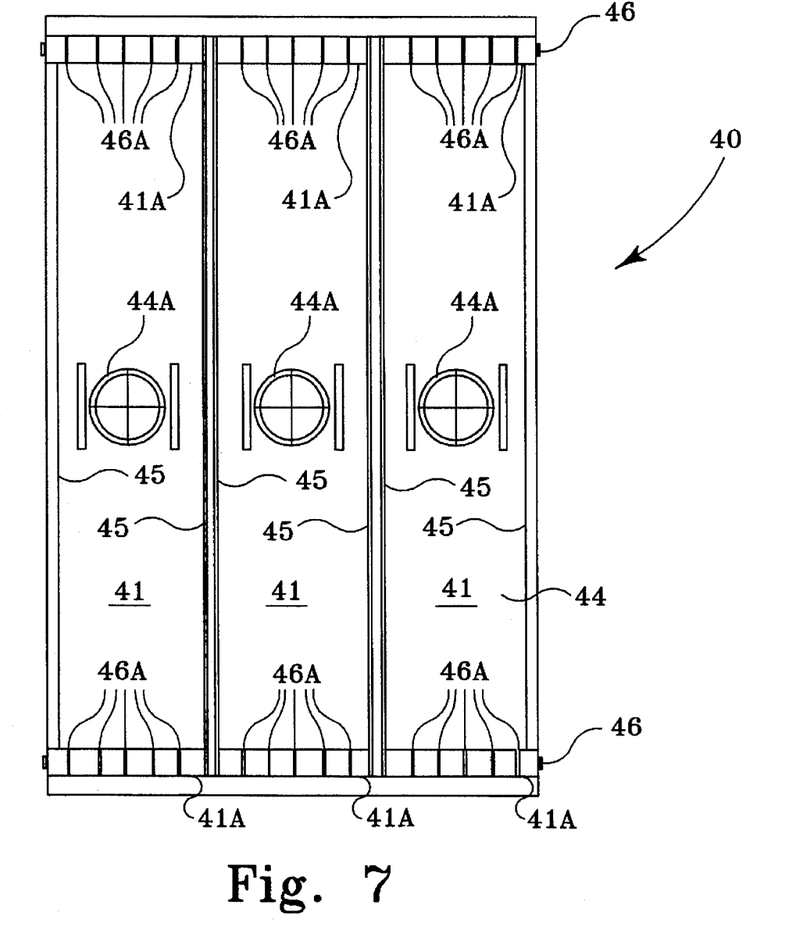
FIG. 7 is a cross-sectional view of the apparatus of FIGS. 1, 3 and 4 taken at a plane corresponding to line 7—7 of FIG. 4.

As noted above, the system also includes means 40 forming a vapor booth for a portion of a conveyer 12 which carries articles of glassware through the vapor booth 40. The means 40 forming the vapor booth is shown in greater detail in FIGS. 3 and 4, and 6–8. The means 40 forms a thermally isolated, partially heated vapor booth connected with the vapor output of the coating material reservoir 22. Means 40 forms at least one plenum 41, and preferably a plurality of plenums 41, having at least one and preferably two openings 41a in communication with the enclosed conveyer portion 12 and also having fan means 42 for creating a circulation of coating material vapor within the plenum 41 and the enclosed conveyer portion 12, as shown in FIG. 4. As shown in FIGS. 3, 4 and 7 the preferred plurality of plenums is formed by a booth top 43, an upper plate 44 and a plurality of partitions 45. As best shown in FIG. 3, the plurality of partitions 45 form a plurality of plenums 41 arranged one after the other, over and along the conveyer portion 12.

Figure 8:
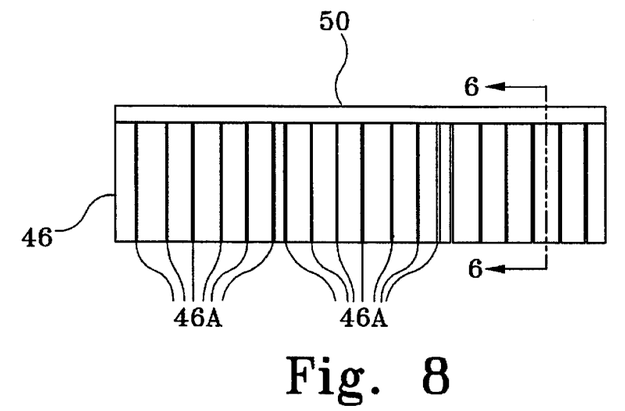
FIG. 8 is a cross-sectional view of the apparatus of FIGS. 1, 3 and 4 taken at a plane corresponding to line 8—8 of FIG. 4 and showing the interior of the booth side forming means.

Means 40 further includes a pair of downwardly extending side forming means 46 forming the vapor booth. The booth side forming means can provide means 47 for supporting the vapor booth from the structure 12a of conveyer portion 12 as shown in FIG. 4. As shown in FIGS. 4, 6, 7 and 8, each of the side forming means 46 is open and in communication with each of the plurality of plenums 41 at the plenum openings 41a. As best shown in FIGS. 6–8, each of the side forming means 46 carries a plurality of flow directing and controlling vanes 46a.

As indicated in FIGS. 3 and 4, the upper plate 43 has a plurality of openings one at each of the plurality of plenums 41 for carrying fan means 42 in each of the plurality of plenums 41. The booth top 44 also has a plurality of openings 44a, at least one for each plenum, permitting vapor flow between the plurality of plenums 41 and the conveyer enclosure formed by the booth top and sides of means 40. The booth top 44 can carry one or more strip heaters to help maintain the enclosed conveyer portion above the melting point of the coating material. Preferably, the booth top 44 carries a plurality of strip heaters, with at least one strip heater being carried in each plenum, and each of the plurality of strip heaters is individually controllable to provide a maintained temperature in each plenum. The strip heaters can be located at any convenient location on the booth top 44 and are not shown in the figures.

As shown in FIG. 4, the fan means 42 comprise a plurality of flow producing fans 42a and fan motors 42b carried by the upper plate 43 with their respective fans 42a being located in each of the plenums 41. As indicated in FIG. 3, the fans 42a are preferably rotated by their fan motors 42b in alternating, opposite directions, as shown in FIG. 3 clockwise at the top, counterclockwise in the center, and clockwise again at the bottom of FIG. 3. The alternating opposite directions provide a plurality of counter-rotating flows of coating material vapor within the conveyer enclosure along the conveyer portion 12.

As indicated in FIG. 3, a plurality of vapor discharge tubes 47 are connected through a conduit 48 with a vapor output of the coating material reservoir 22. The plurality of discharge tubes 47 extend into the means 40 forming the vapor booth from each side of the vapor booth (only one side being shown in FIG. 3). The outlets 47a of the plurality of discharge tubes 47 can be arranged at a plurality of locations along the conveyer portion, as shown in FIG. 3, to direct a flow of coating material vapor into the flow of each plenum. As shown in FIG. 4, the coating material vapor will be carried by the counter-rotating flows within the plenum and enclosed container portion to encompass and coat glassware carried by the conveyer 12. As further indicated in FIGS. 4, 6, 7 and 8, the means 40 forming the vapor coating booth may, if desired, be provided with a blanket of insulation 50.

The means 40 illustrated in FIGS. 3, 4 and 6–8 is intended for use with a glassware production line having a width, as measured by conveyor width, of up to about eight feet. Where the production line is wider than about eight feet, for example, with a conveyer belt 12 feet wide, it is advisable that the vapor booth top carry two sets of blowers or fans, for circulation of the coating material vapor. In vapor booths that are 12 feet wide, the two sets of blowers, or fans, are equally spaced from the booth sides, preferably about three feet to four feet from each side, and the blowers, or fans in each plenum preferably rotate in the same direction.

FIG. 3 illustrates the means forming the vapor booth from above and without a blanket of insulation 50 to show other features of the vapor booth. For example, the upper plate may be provided with a plurality of doors 51 permitting access into the plurality of plenums from above the vapor coating booth.

Because the coating apparatus 10 is located generally adjacent the annealing lehr for the glassware, the glassware is carried through the vapor coating means 40 while still at an elevated temperature and heat transfer from the heated glassware will maintain the enclosed container portion at an elevated temperature. Accordingly, the inclusion of strip heaters on the booth top may be needed only to supplement the heat transferred into the enclosed conveyer portion by the glassware, or to place the vapor booth is in the ready condition when glassware is not being coated.

As clear from the description above, applicant's invention provides a method for forming a coating on glassware by conveying a series a glassware articles to be coated at elevated temperatures through a coating zone adjacent a portion of the conveyer. By providing means 40, a portion of the conveyer is enclosed and thermally isolated to provide a coating zone, and the coating zone may be heated to provide an elevated temperature along the conveyer portion. By liquefying normally solid coating material through the elevation of its temperature, a plurality of controlled flows of liquified coating material may be produced and directed at elevated temperatures to a plurality of coating material atomizers, or vaporizers. By additionally producing and directing a plurality of control flows of pressurized air to the plurality of vaporizers, a plurality of controlled flows of liquified coating material may be atomized or vaporized with the plurality of controlled flows of pressurized air, and the atomized liquified coating material may be entrained in a plurality of flows of heated air. The plurality of flows of air and entrained particles of liquified coating material may be directed from the atomizers into a heated vapor chamber, which can remove by gravity of non-vaporous, i.e., high mass to surface ratio, coating material particles, and a plurality of flows of air and entrained vaporous liquified coating material are directed to the enclosed and thermally isolated coating zone. By providing a plurality of circulating and counter-rotating currents of heated air in the enclosed and thermally isolated coating zone, and by introducing the plurality of flows of heated air and entrained vaporous coating material into the plurality of circulating, counter-rotating currents of heated air within the enclosed and thermally isolated coating zone, a series of glassware articles may be coated by impingement of the coating material particles on the glassware articles in the coating zone, and upon removal of the glassware articles from the heated, thermally isolated coating zone, the deposited coating material cools to form a solid coating on the glassware.

A preferred coating material for use with this method is stearic acid (octadecanoic acid), which has a melting point of about 70° C. or 157° F. Stearic acid oxidizes easily at elevated temperatures and degrades at the elevated temperatures of glass manufacturing operations; thus, the application of stearic acid must be carefully effected. In the apparatus and method of the invention, however, stearic acid is liquified, atomized and deposited and forms a tenacious bond to hot end metal oxide coated surfaces of glassware, it is believed, through the —COOH group of the stearic acid. With the method and apparatus of this invention, one to two pounds of stearic acid, uniformly applied, can provide the effective coating of this invention on one gross of glass containers, such as baby food jars, per minute for three shifts, or about 24 hours, can eliminate the need for an additional polyethylene cold end coating and may reduce the hot end tin oxide coating by one-half.

EXAMPLE I

A prior art coating apparatus like that described and shown in FIG. 9 of U.S. Pat. No. 3,989,004 was used to provide a commercial prior art coating for comparison with the invention. Oleic acid was atomized in an atomizer thereby forming oleic acid vapor and conducted into the coating hood. Circulation of the vapor was accomplished by a fan operating in the manner shown in FIG. 9 of U.S. Pat. No. 3,989,004.

A first portion of glassware which had received a tin oxide hot end coating was placed in the coating hood at a temperature somewhat above 200° F. for a period of about 120 seconds. The vapor was maintained above the vaporization point of the oleic acid. The treatment resulted in formations of a completely transparent coating on the glassware samples.

The invention was then used to prepare samples for comparative testing. A coating apparatus as shown and described above was used to coat a second portion of the glassware that had received the tin oxide hot end coating. The vapor booth 40 was heated to a temperature of 250° F. Solid state stearic acid was liquified in the reservoir 22 and provided to means 28 for providing micron-sized coating material particles in a flow of heated air. The resulting micron-sized particles, or vapor, of liquid stearic acid were introduced into the vapor booth 40 at a rate of one pound of solid material per day. The second portion of the glassware was placed in the vapor booth 40 at about 250° F. and the bottles were exposed to coating material in the vapor booth 40 for a period of 120 seconds.

Samples were selected at random from the first portion of glassware, which was provided by the prior art with an oleic acid coating, and from the second portion of glassware which was coated with the invention. The samples with both coatings were placed in an autoclave, which was provided with steam at 250° F. and 15 pounds per square inch for one hour. The samples were then removed from the autoclave and allowed to cool for testing.

The samples were then tested for scratch resistance using an industry standard scratch test. Only 25 pounds of force resulted in scratches in the autoclaved samples that had been provided by the prior art with an oleic acid coating. The scratch resistance of the autoclaved samples coated with the invention exceeded the test force available with the test equipment, that is, with the test equipment applying its maximum force, the stearic acid coated samples remained scratch resistant at forces exceeding 70 pounds.

EXAMPLE II

A third portion of glassware, which had received a tin oxide coating having one-half the weight of the first and second portions of Example I, was coated with the invention in the same manner as the second portion of Example I, was placed in the autoclave with the first and second portions of Example I, and was removed from the autoclave and tested for scratch resistance in the same manner as the first and second portions of Example I. The third portion of glassware, which had been provided with a stearic acid coating in accordance with the invention, over a tin oxide hot end coating of one-half the weight of the hot end coatings of the first and second portions, also had a scratch resistance that exceeded the test force available with the test equipment.

With this invention, glassware can be provided with an unexpectedly effective coating by providing the glassware to be coated to an enclosed conveyer portion, atomizing normally solid coating material into liquid micron-sized, vaporous particles, circulating the resulting liquid particles in a heated thermally isolated coating zone adjacent the glassware surfaces to be coated, and depositing the micron-sized liquid coating material particles on the hot glassware surfaces with flows of heated air. The method is performed at a temperature greater than the melting point of the coating material but below its degradation temperature, for example, preferably in the range from about 250° F. to about 300° F. and most preferably at about 250° F. where stearic acid is used. The glassware is preferably at a temperature of about 250° F. but may be at a lesser temperature, preferably above the melting point of the coating material. In the method, a continuous coating need not be formed. Notwithstanding the lack of coating continuity, the resultant coating can be unexpectedly lubricous and durable and provide the other advantages set forth above.

Various modifications may be made in the method and apparatus shown and described above without departing from the scope of this invention as defined by the prior art and the claims that follow.

We claim:

1. A method of forming a coating on glassware articles, comprising enclosing and thermally isolating a conveyer portion to provide a coating zone, conveying a series of glassware articles to be coated at elevated temperature through said coating zone, heating said coating zone to provide an elevated temperature along said conveyer portion, providing coating material in a heated tank, said tank including a heated reservoir and a heated vapor chamber separated by an internal wall, said coating material being located in the reservoir, liquefying the coating material by elevating its temperature in the reservoir, producing and directing at least one controlled flow of the liquified coating material at elevated temperature along an internal path from the reservoir to at least one heated vaporizer positioned on a wall of the tank and adjacent the reservoir and the vapor chamber, said internal path including an opening in a first wall between the reservoir and an inlet of the at least one vaporizer, producing and directing at least one controlled flow of pressurized air to said at least one vaporizer, atomizing said at least one controlled flow of liquified coating material into vaporous particles with said at least one controlled flow of pressurized air and entraining the atomized vaporous particles in the at least one flow of air, directing the at least one flow of air and entrained vaporous particles via said internal path from the At least one vaporizer into the heated vapor chamber, said internal path including an opening in the first wall between an outlet of the at least one vaporizer and the vapor chamber, directing at least one flow of air and entrained vaporous liquified coating material particles from the heated vapor chamber to the enclosed and thermally isolated coating zone, introducing said at least one flow of air and entrained vaporous particles into the enclosed and thermally isolated coating zone, coating said series of glassware articles by impingement of the vaporous particles on the glassware articles in the coating zone; and cooling said glassware articles to form a solid coating thereon.

2. The method of claim 1 wherein said coating material is stearic acid liquified in said liquefying step and formed into micron-sized vaporous particles of stearic acid in the atomizing step, and said micron-sized vaporous particles of stearic acid are directed to the coating zone such that a coating of stearic acid is deposited on the glassware articles.

3. The method of claim 2 wherein the enclosed and thermally isolated coating zone is maintained at a temperature in excess of the melting point of stearic acid but below about 400° F.

4. The method of claim 4 wherein the enclosed and thermally isolated coating zone is maintained at a temperature of about 250° F.

5. The method of claim 2 wherein the glassware articles enter the enclosed coating zone at temperatures above the melting point of stearic acid.

6. The method of claim 5 wherein the glassware articles enter the enclosed coating zone at a temperature of about 250° F.

7. The method of claim 2 wherein the stearic acid is applied at a rate of about one to two pounds per day to the glassware articles at a rate of one gross per minute.

8. The method of claim 1 wherein the glassware articles are provided with a tin oxide hot end coating prior to being conveyed through the coating zone.

9. A method of forming a coating on glassware articles, the method comprising the steps of:

enclosing and thermally isolating a conveyer portion to provide a coating zone, conveying a series of glassware articles to be coated at elevated temperature through said coating zone, heating said coating zone to provide an elevated temperature along said conveyer portion, liquefying coating material by elevating its temperature in a heated tank, said tank including a heated reservoir and a heated vapor chamber separated by an internal wall, said coating material being located in the reservoir, producing and directing at least one controlled flow of the liquified coating material at elevated temperature to at least one heated vaporizer positioned on the tank adjacent the reservoir and vapor chamber, producing and directing at least one controlled flow of pressurized air to said at least one vaporizer, atomizing said at least one controlled flow of liquified coating material into vaporous particles with said at least one controlled flow of pressurized air and entraining the vaporous particles in the at least one flow of air, directing the at least one flow of air and entrained vaporous particles into the heated vapor chamber, directing the at least one flow of air and entrained vaporous particles from the heated vapor chamber to the enclosed and thermally isolated coating zone, introducing said at least one flow of air and entrained vaporous particles into the enclosed and thermally isolated coating zone, coating said series of glassware articles by impingement of the vaporous particles on the glassware articles in the coating zone; and cooling said glassware articles to form a solid coating thereon.

10. The method of claim 9, wherein the step of directing a plurality of flows of air and entrained vaporous particles into the heated vapor chamber includes the step of directing the flows through a heated internal path formed by attaching the at least one vaporizer to a first wall of the tank means so as to provide a direct inlet to the at least one vaporizer from the reservoir through a first opening in the first wall and a direct inlet to the vapor chamber from the at least one vaporizer through a second opening in the first wall to provide an internal heated path for the liquified coating material from the heated reservoir through the at least one heated vaporizer to the heated vapor chamber.

11. The method of claim 9 wherein said coating material is stearic acid liquified in said liquefying step and formed into micron-sized vaporous particles of stearic acid in the atomizing step, and said micron-sized vaporous particles of stearic acid are directed to the coating zone such that a coating of stearic acid is deposited on the glassware articles.

12. The method of claim 11, wherein the glassware articles enter the enclosed coating zone at temperatures above the melting point of stearic acid.

13. The method of claim 11, wherein the glassware articles enter the enclosed coating zone at a temperature of about 250° F.

14. A method of forming a coating on glassware articles, the method comprising the steps of:

enclosing and thermally isolating a conveyer portion to provide a coating zone, conveying a series of glassware articles to be coated at elevated temperature through said coating zone, heating said coating zone to provide an elevated temperature along said conveyer portion, liquefying coating material by elevating its temperature in a heated tank means having a reservoir and a vapor chamber separated by an internal wall, the internal wall being formed to include valve means for providing fluid communication between the reservoir and the vapor chamber so that pressurization of the vapor chamber urges condensed vaporized particles from the vapor chamber through the valve means into the reservoir, producing and directing a plurality of controlled flows of the liquified coating material at elevated temperature to a plurality of vaporizers, producing and directing a plurality of controlled flows of pressurized air to said plurality of vaporizers, atomizing said plurality of controlled flows of liquified coating material into vaporous particles with said plurality of controlled flows of pressurized air and entraining the vaporous particles in the plurality of flows of air, directing the plurality of flows of air and entrained vaporous particles into the heated vapor chamber, directing the plurality of flows of air and entrained vaporous particles from the heated vapor chamber to the enclosed and thermally isolated coating zone, providing a plurality of circulating and counter-rotating currents of air in the enclosed and thermally isolated coating zone, introducing said plurality of flows of air and entrained vaporous particles into the plurality of circulating and counter-rotating currents of heated air within the enclosed and thermally isolated coating zone, with at least one flow of heated air and entrained vaporous liquified coating material particles being introduced into each current of air for circulation in the coating zone, coating said series of glassware articles by impingement of the vaporous particles on the glassware articles in the coating zone; and cooling said glassware articles to form a solid coating thereon.

* * * * *

UNITED STATES PATENT AND TRADEMARK OFFICE
CERTIFICATE OF CORRECTION

PATENT NO. : 5,498,758

DATED : March 12, 1996

INVENTOR(S) : Addison B. Scholes, et al.

It is certified that error appears in the above-indentified patent and that said Letters Patent is hereby corrected as shown below: Title page, In the Abstract, line 6, delete "liquified" and insert therefor --liquefied--.

In Col. 4, line 43, after "show", delete "of".

In Col. 8, line 57, delete "is".

In Col. 8, line 59, after "As" insert --is--.

In Col. 8, line 61, after "series" delete "a" and insert therefor --of--.

In Col. 9, line 30, delete "octadecanoic" and insert therefor --octadecenoic--.

In Col. 11, line 34, delete "At" and insert therefor --at--.

Signed and Sealed this

Twenty-sixth Day of August, 1997

Attest:

BRUCE LEHMAN

Attesting Officer

Commissioner of Patents and Trademarks